United States Patent [19]
McPartland

[11] Patent Number: 5,604,501
[45] Date of Patent: Feb. 18, 1997

[54] DIGITAL-TO-ANALOG CONVERTER WITH REDUCED NUMBER OF RESISTORS

[75] Inventor: Richard J. McPartland, Nazareth, Pa.

[73] Assignee: Lucent Technologies Inc., Murray Hill, N.J.

[21] Appl. No.: 327,174

[22] Filed: Oct. 21, 1994

[51] Int. Cl.$^6$ .............................. H03M 1/78; H03K 13/00
[52] U.S. Cl. ............................................ 341/144; 341/154
[58] Field of Search .................................. 341/144, 154, 341/145, 153, 136

[56] References Cited

U.S. PATENT DOCUMENTS

| | | | |
|---|---|---|---|
| 3,611,353 | 10/1971 | Shipp et al. | 340/347 DA |
| 4,034,366 | 7/1977 | Memishian, Jr. | 340/347 AD |
| 4,263,664 | 4/1981 | Owen et al. | 365/185 |
| 4,281,319 | 7/1981 | Roberts, Jr. | 340/347 |
| 4,292,625 | 9/1981 | Schoeff | 340/347 DA |
| 4,293,848 | 10/1981 | Cheng et al. | 340/347 AD |
| 4,393,370 | 7/1983 | Hareyama | 340/347 DA |
| 4,520,461 | 5/1985 | Simko | 365/184 |
| 4,617,652 | 10/1986 | Simko | 365/203 |
| 4,668,932 | 5/1987 | Drorf et al. | 338/48 |
| 4,764,750 | 8/1988 | Kawada | 340/347 AD |
| 4,896,157 | 1/1990 | Mijuskovic | 341/144 |
| 4,904,922 | 2/1990 | Colles | 323/316 |
| 5,010,337 | 4/1991 | Hisano et al. | 341/154 |
| 5,014,054 | 5/1991 | Oshita et al. | 341/145 |
| 5,016,014 | 5/1991 | Bitting | 341/162 |
| 5,036,322 | 7/1991 | Barrow et al. | 341/144 |
| 5,039,747 | 8/1991 | Piejko et al. | 525/197 |
| 5,049,882 | 9/1991 | Gorecki et al. | 341/143 |
| 5,059,978 | 10/1991 | Valdenaire | 341/145 |
| 5,079,552 | 1/1992 | Pelgrom et al. | 341/148 |
| 5,181,034 | 1/1993 | Takakura et al. | 341/144 |

FOREIGN PATENT DOCUMENTS

| | | | |
|---|---|---|---|
| 0123222 | 10/1984 | European Pat. Off. | H03K 13/05 |
| 0521629A2 | 6/1992 | European Pat. Off. | H03M 1/68 |
| 3333067A1 | 9/1983 | Germany | H03K 13/02 |

Primary Examiner—Jeffrey A. Gaffin
Assistant Examiner—Peguy JeanPierre
Attorney, Agent, or Firm—David L. Smith

[57] ABSTRACT

There is disclosed a digital-to-analog converter including a resistor string having intermediate taps at resistor junctions as well as resistor-potential junctions. Switching transistors are coupled between a respective intermediate tap and an output node. Decode circuits are capable of switching at least two transistors to be in the on state at the same time to electrically couple more than one intermediate tap to the output node to produce at least one analog output. In one embodiment, one row select line can be energized simultaneously with at least two column select lines. Alternatively, at least two row select lines can be energized simultaneously with one column select line. A DAC in accordance with the present invention is suitable for fabrication in the form of a monolithic integrated circuit and requires less area while maintaining the same degree of resolution as prior art DACs. The DAC also may be used with successive approximation circuitry to provide an analog-to-digital converter.

8 Claims, 4 Drawing Sheets

DIGITAL-TO-ANALOG CONVERTER WITH REDUCED NUMBER OF RESISTORS

TECHNICAL FIELD

This invention relates generally to integrated circuits having digital-to-analog converters (DACs), and more particularly to such converters requiring fewer resistors in a resistance string to achieve a given level of resolution than were required by prior art DACs.

BACKGROUND OF THE INVENTION

DACs are used to convert a digitally coded signal to an analog signal, or in conjunction with successive approximation circuitry as part of an analog-to-digital converter. DACs convert a digitally coded signal to an analog signal that is proportional to the digital signal. The analog signal can take on many different values depending on the resolution. The range of analog values is predetermined and corresponds to the range of digitally coded signals. DACs may employ a single resistor string comprised of equal resistance resistors. The resistor string has intermediate taps between adjacent resistors in the resistor string as well as between the resistor string and an energy source energizing the resistor string. Switches, coupled between respective intermediate taps and an output node, when turned on electrically couple the intermediate tap to the output node, and isolate the intermediate tap from the output node when turned off.

A digitally encoded signal is provided to a decoding/driver circuit. The decoding circuit decodes the digitally encoded signal and turns on the appropriate switch to conduct the voltage at its associated intermediate tap to the output. Typically only a single switch is turned on at a time, resulting in a single intermediate tap being coupled to the output. A monotonic input-output characteristic that is a staircase output voltage is derived from the resistor-division voltage at the intermediate taps. The magnitude of the incremental steps in the output voltage is the voltage drop across one of the resistors of the resistor string.

SUMMARY OF THE INVENTION

In accordance with an illustrative embodiment of the present invention, a digital-to-analog converter includes a resistor string having intermediate taps. Switching transistors are coupled between an output node and respective intermediate taps. Decode circuits for decoding a digitally coded signal are capable of switching at least two transistors to be in the on state simultaneously to generate at least some of the analog voltages. Having at least two transistors switched to the on state electrically couples more than one intermediate tap to the output node to generate a single analog signal. In one embodiment having an array of resistors and switching transistors arranged in an array of rows and columns, one row select line can be energized simultaneously with at least two column select lines. Alternatively, at least two column select lines can be energized simultaneously with one row select line. The DAC also may be used with successive approximation circuitry to provide an analog-to-digital converter.

DETAILED DESCRIPTION

Figure 1:
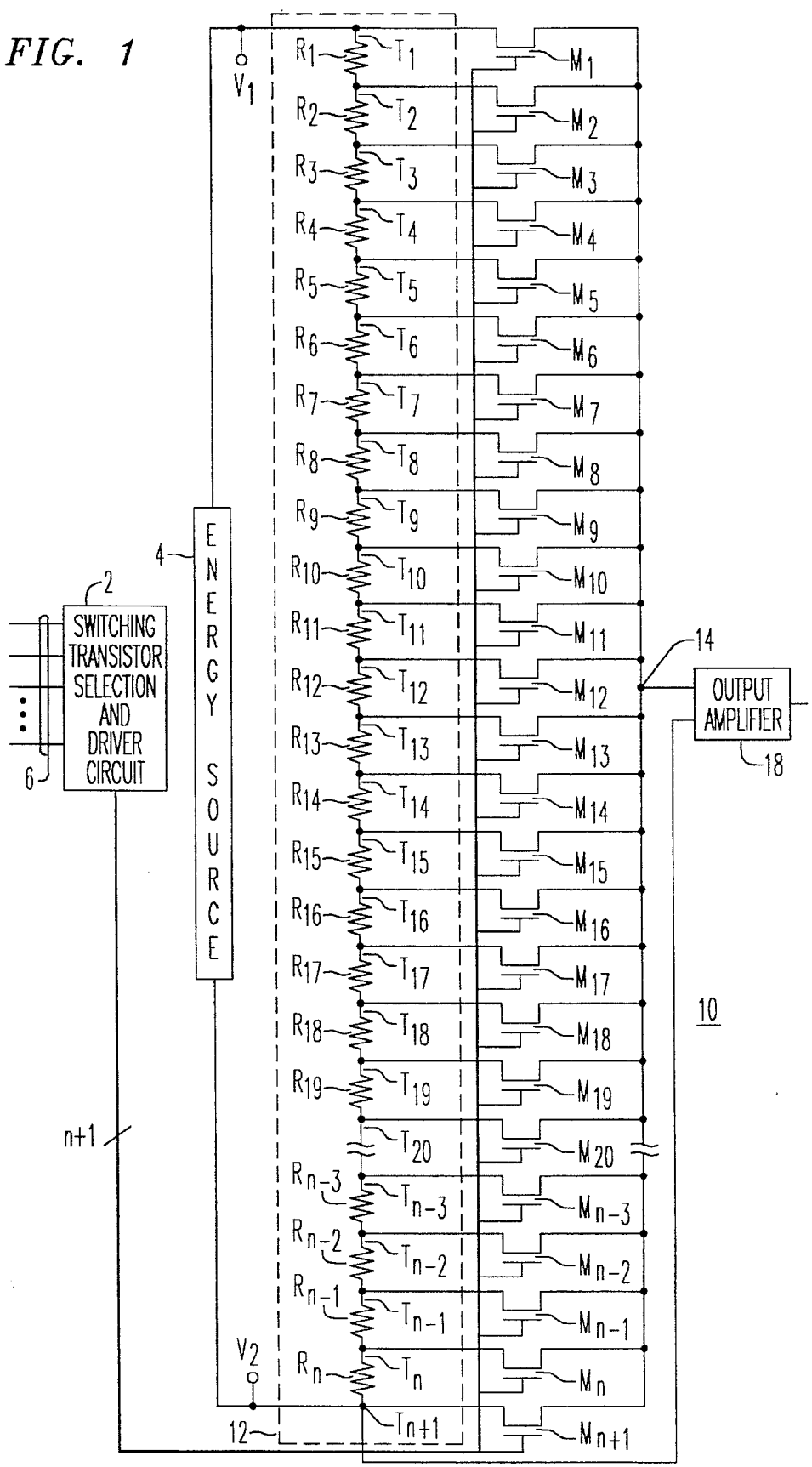
FIG. 1 is a schematic diagram of a portion of a digital-to-analog converter in accordance with an illustrative embodiment of the present invention.

The schematic diagram of a DAC 10 incorporating an illustrative embodiment of the present invention is shown in FIG. 1. DAC 10 includes a resistor string coupled between two potential values and energized by an energy source. Switches controlled by a selection and driver circuit couple intermediate taps to a common output node. The magnitude of an analog voltage appearing at the output node depends on which switch or switches are activated. The output is amplified by an output amplifier. A DAC in accordance with the present invention is suitable for fabrication in the form of a monolithic integrated circuit.

Resistor string 12 is comprised of a number, n, of resistors of equal resistance in series. The resistors are denoted $R_1$ through $R_n$. In a preferred embodiment, resistor string 12 is a thin film metal resistor network on a silicon layer. Resistor string 12 is coupled across and energized by energy source 4, which may be either a voltage or a current source. The resistance values of the resistors comprising the resistor string are application dependent and will be readily selected based on a variety of parameters such as the power to be dissipated, the potential across the resistor string, and the number of resistors in the resistor string. For single-ended mode operation, $V_1$ may be substantially the power supply voltage, and $V_2$ may be ground potential as provided by energy source 4. At the resistor junctions, as well as the potential-resistor junctions, switches are coupled between an output node 14 and a respective junction. These junctions are referred to as intermediate taps.

A switch, shown in the illustrative embodiment as a MOS transistor, is coupled between a respective intermediate tap and output node 14. Transistors $M_2$ through $M_n$ are coupled between the output node and intermediate taps $T_2$ through $T_n$, which are between contiguous resistors in the resistor string. Transistor $M_1$ is coupled between potential $V_1$ and output node 14, thereby defining intermediate tap $T_1$. Transistor $M_{n+1}$ is coupled between potential $V_2$ and output node 14, thereby defining intermediate tap $T_{n+1}$. Transistors $M_1$ through $M_{n+1}$ each couple a respective intermediate tap, $T_1$ through $T_{n+1}$, with output node 14. The transistors $M_1$ through $M_{n+1}$ are switching transistors that are nominally identical and have an impedance in the conductive state that is very large compared to the resistance of resistors $R_1$ through $R_n$ in resistor string 12. The conductive impedance of the switching transistors is on the order of 1,000 to 10,000 ohms. Output amplifier 18 amplifies the output signal at output node 14 and may convert the output to another form, such as from a voltage output to a current output.

The switching transistors $M_1$ through $M_{n+1}$ are controlled by switching transistor selection and driver circuit 2. Switching transistor selection and driver circuit 2 receives a digitally coded input 6 and, as described in more detail below, switches on selective ones of the switching transistors.

In accordance with the present invention, two or more transistors $M_1$ through $M_{n+1}$ can be switched to simultaneously be in the on state. This provides an output with a resolution, defined as the smallest change that can occur in the analog output as a result of a change in the digital input, that is smaller than the differential voltage across individual resistors $R_1$ through $R_n$ that comprise resistor string 12.

With two switching transistors switched to simultaneously be in the on state, two intermediate taps are electrically coupled to output node 14. The analog voltage appearing at output node 14 is an intermediate voltage that is substantially halfway between the voltages at the intermediate taps electrically coupled to the output node. In the illustrative embodiment shown in FIG. 1, when two adjacent intermediate taps are electrically coupled to output node 14 at the same time, the switching transistors turned on to electrically couple the intermediate taps to the output node are also adjacent to each other. The invention, however, is not so limited. The switching transistors need not be adjacent, and the intermediate taps coupled to the output node need not be adjacent.

Figure 2:
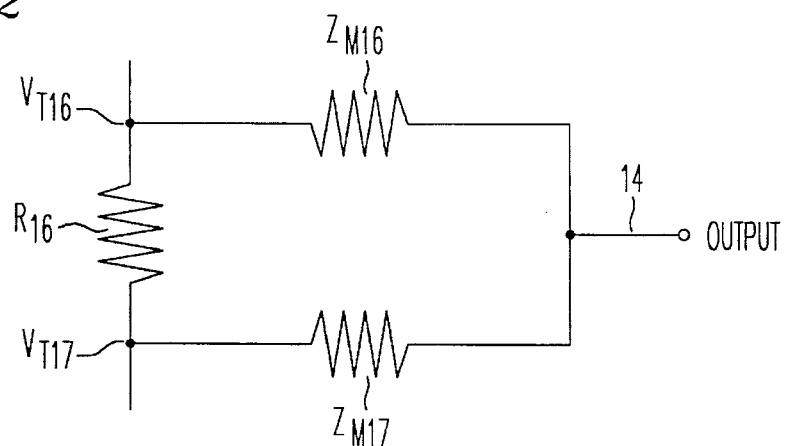
FIG. 2 is an equivalent circuit schematic diagram with two adjacent intermediate junctions electrically coupled to an output node.

Employing this technique and being able to electrically couple two intermediate taps to the output node, the number of resistors in a resistor string can be reduced by half with the percentage resolution of a DAC maintained. In other words, the number of resistors in a resistor string and the number of switching transistors can be reduced by half without the number of possible levels in the analog output being reduced. Half of the possible levels in the analog output require a single transistor to be switched on to electrically couple a voltage at an intermediate tap to the output node. The other half of the possible levels in the analog output require two transistors to be switched on so that a voltage between the voltage at the two intermediate taps electrically coupled to the output node is provided at output node 14. For example, with transistors $M_{16}$ and $M_{17}$ switched to be in the on state and all of the other switching transistors in FIG. 1 switched to be in the off state, the resulting equivalent circuit is shown in FIG. 2. Since the impedance of the transistors $M_{16}$ and $M_{17}$, represented as $Z_{M16}$ and $Z_{M17}$, are substantially identical and large compared to $R_{16}$, the voltage at output node 14 is substantially halfway between the voltage at intermediate taps $T_{16}$ and $T_{17}$. A small error is present, but it is acceptable as a trade-off for the substantial reduction in both the number of resistors in the resistor string and the number of switching transistors, and hence a reduction in the area of silicon required to fabricate the resistor string and switching transistors in an integrated circuit.

By selectively turning on other combinations of transistors $M_1$ through $M_{n+1}$, other intermediate voltage levels can be achieved. Generally, turning on k transistors simultaneously results in increments of voltage at output node 14 of 1/k times the differential voltage between adjacent intermediate taps. A corresponding reduction in the number of resistors in the resistor string and switching transistors is achieved.

Figure 3:
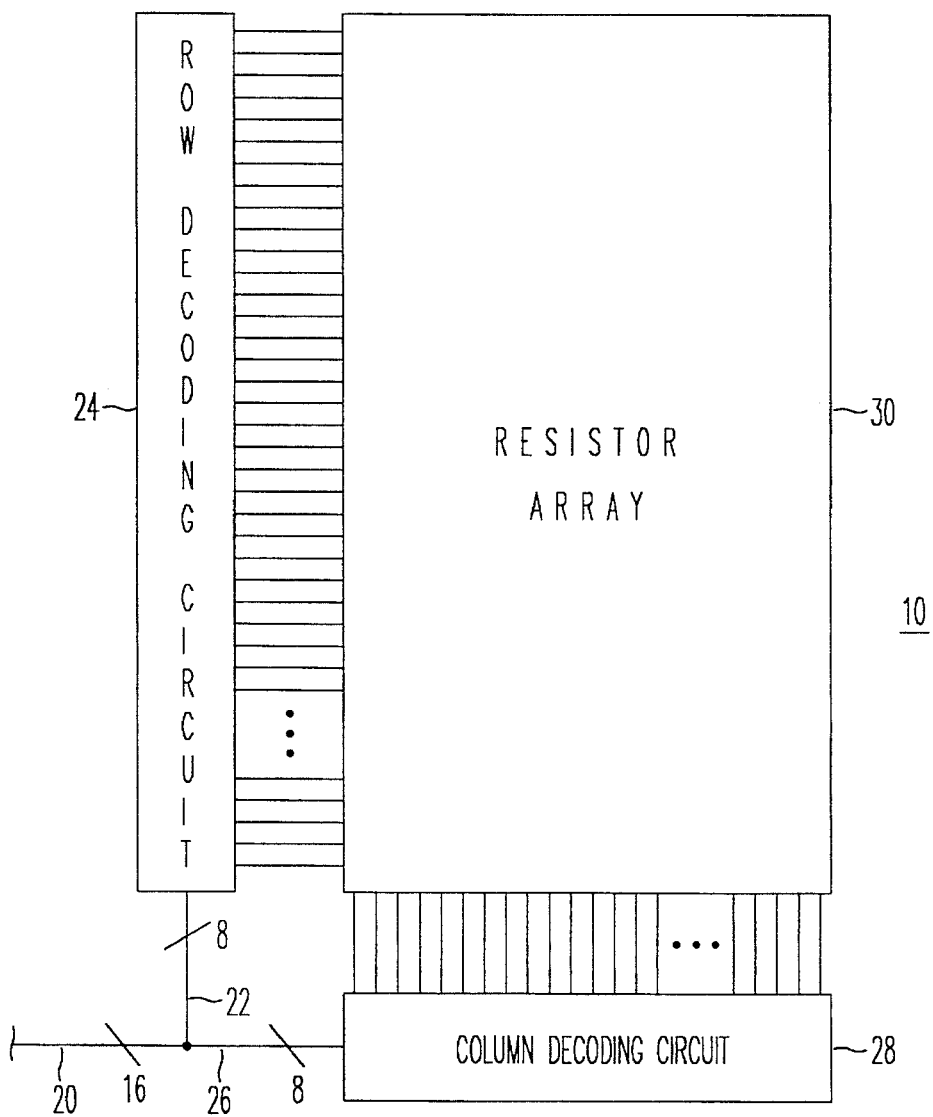
FIG. 3 is a schematic diagram of a digital-to-analog converter including row and column decoder circuits.

FIG. 3 shows schematically the construction of a DAC in accordance with an illustrative embodiment of the present invention. DAC 10 is configured like a memory with row and column decoding circuits to select the transistor or transistors to turn on and hence generate the desired analog output voltage that corresponds to a digital input to the DAC.

The illustrative embodiment shown in FIG. 3 represents a 16 bit DAC. Switching transistor selection and driver circuit 2 is shown comprising row decoding circuit 24 and column decoding circuit 28. Bus 20 delivers 16 bits to DAC 10. Eight of the 16 bits are provided on bus 22, a subset of bus 20, to row decoding circuit 24. The remaining 8 bits are provided on bus 26, also a subset of bus 20, to column decoding circuit 28. Row decoding circuit 24 and column decoding circuit 28 are combinatorial logic. Such combinatorial logic can be designed by one of ordinary skill in the art to decode the bits received and drive one or more rows or columns.

In the illustrative embodiment, eight bits are received by each decoding circuit. The eight bits received by row decoding circuit 24 are decoded to determine which one of $2^8$, or 256, row select lines to activate. The eight bits received by column decoding circuit 28 are decoded to determine which one or two of $2^7$, or 128, column select lines to activate. One possible convention used to determine which additional intermediate tap is electrically coupled to output node 14 is described in greater detail below.

Figure 4:
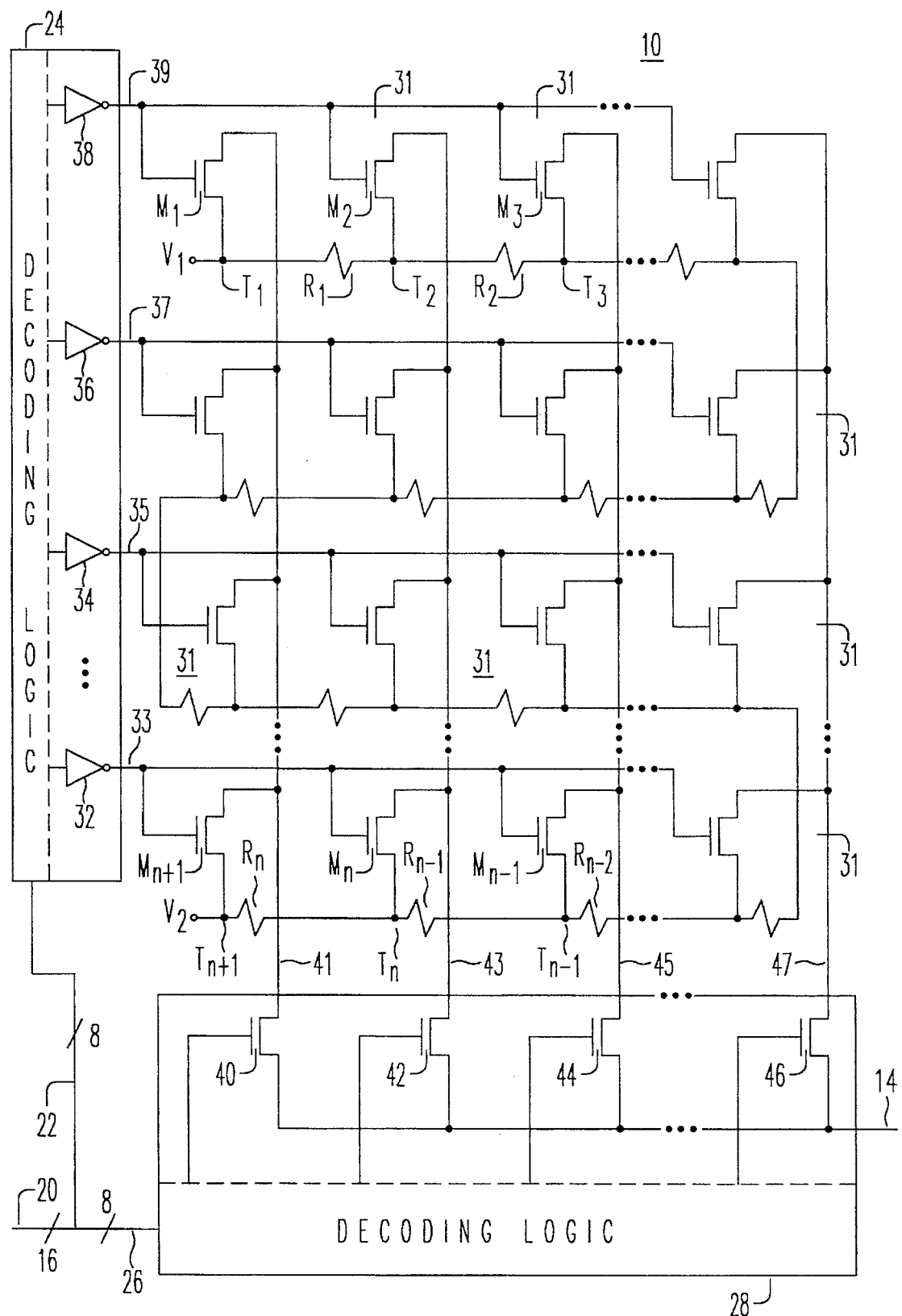
FIG. 4 is a more detailed schematic diagram of the digital-to-analog converter of FIG. 3.
Figure 5:
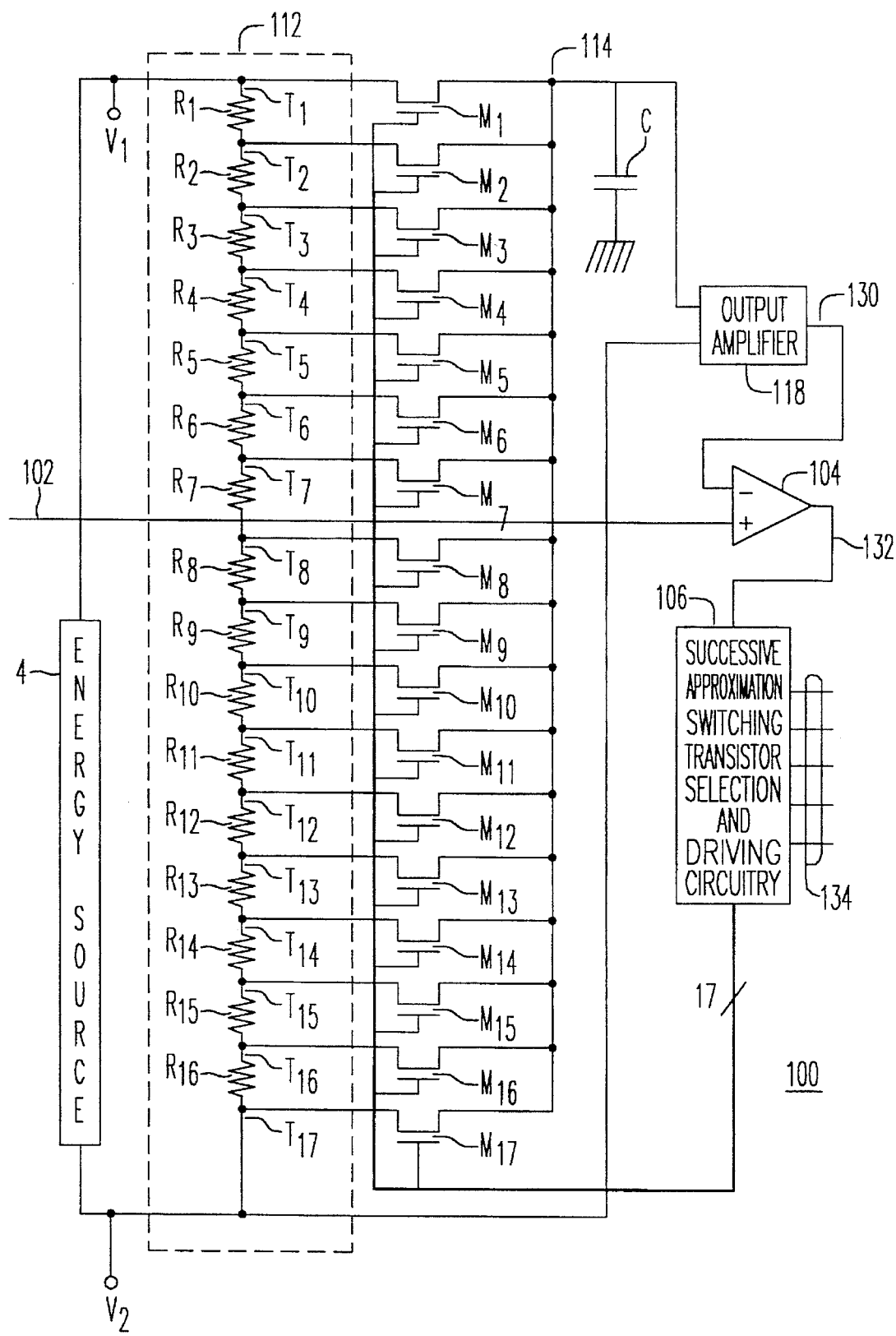
FIG. 5 is a schematic diagram of an analog-to-digital converter in accordance with the present invention.

An illustrative portion of resistor array 30 is shown in greater detail in the schematic diagram of FIG. 4. Resistor string 12 is positioned in the region of resistor array 30 arranged in an array of one less than 256×128 resistor selecting cells 31, with a fixed resistance per cell. To couple an intermediate tap to output node 14, the eight bit binary input to row decoding circuit 24 is decoded. A row select line driver 32, 34, 36, or 38 within row decoding circuit 24 energizes a respective row select line 33, 35, 37, or 39 to energize the gate of each transistor in a row of cells.

Similarly, the eight bit binary input to column decoding circuit 28 is decoded. Based on seven of the eight bits, a column select line driver 40, 42, 44 or 46 within column decoding circuit 28 energizes a respective column select line 41, 43, 45, or 47 to couple the source of the switching transistors in a column of cells to output node 14. The eighth bit is decoded by the column decoding circuit 28 to turn on a second column select line driver 40, 42, 44, or 46.

At the intersection of a row of cells having the switching transistor gate energized by a row select line, and a column of cells having the switching transistor source coupled to output node 14 is a cell in which the transistor gate is energized and the transistor source is coupled to the output. In this cell, the intermediate tap is coupled to output node 14.

To couple more than one intermediate tap to output node 14 simultaneously, either another column select line driver 40, 42, 44 or 46 is energized or another row select line driver 32, 34, 36 or 38 is energized. In the illustrative embodiment, a second column select line driver is energized to also couple an adjacent intermediate tap in resistor string 12 to output node 14. For example, if row select line driver 38 and column select line driver 42 are energized coupling intermediate tap $T_2$ to output node 14, either column select line driver 40 or 44 could be energized. Energizing column select line driver 40 energizes column select line 41 to also couple intermediate tap $T_1$ to output node 14 whereas energizing column select line driver 44 energizes column select line 45 to also couple intermediate tap $T_3$ to output node 14.

In the illustrative embodiment of the invention, the analog output voltage at output node 14 or output from output amplifier 18 is a stepwise linear function. The largest analog voltage is achieved by coupling intermediate tap $T_1$ to the output node 14. The stepwise voltage levels decreasing in magnitude at output node 14 are then achieved by electrically coupling to output node 14 intermediate taps $T_1$ and $T_2$, $T_2$, $T_2$ and $T_3$, $T_3$, $T_3$ and $T_4$, $T_4$ etc. One less than half of the analog voltage levels requires that two intermediate taps be simultaneously electrically coupled to output node 14 to generate the desired analog voltage. The eight bits received by column decoding circuit 28 are decoded to determine which one or more of the 128 column select lines to activate. Seven of the eight bits determine whether one column select line is to be activated or whether two lines are to be activated. A convention is used to determine which additional column select line to activate and hence which additional intermediate tap is electrically coupled to output node 14. An example showing which intermediate taps are electrically coupled to output node 14 for several eight bit sequences is shown in Table I. The pattern is evident and can be continued for the remaining eight bit sequences. Other conventions are possible.

TABLE 1

| Bits Received By Column Decoding Circuit | Intermediate Tap Coupled To Output |
|---|---|
| 00000000 | $T_1$ |
| 00000001 | $T_1 + T_2$ |
| 00000010 | $T_2$ |
| 00000011 | $T_2 + T_3$ |
| 00000100 | $T_3$ |
| 00000101 | $T_3 + T_4$ |
| 00000110 | $T_4$ |
| 00000111 | $T_4 + T_5$ |

In the illustrative embodiment an exception occurs at the end of a row of cells 31, such as shown in FIG. 4, where the resistor string 12 reverses direction. In these cases, to couple two adjacent intermediate taps to output node 14 may require activating two row select lines and one column select line. The decoding logic in row decoding circuit 24 and column decoding circuit 28 is designed to identify these occurrences and energize the appropriate column and row select lines to produce the desired analog output voltage at output node 14.

Such a DAC provides $2^{16}$ or 65,536 possible output valves. Prior art DACs would require substantially 65,536 resistors and 65,536 switching transistors to achieve the same degree of resolution. The ability to switch on two or more switching transistors to be in the on state simultaneously to generate at least some of the analog values reduces the number of resistors and the number of switching transistors by half or more and still achieves the same degree of resolution in the analog output. In addition, the silicon area required to fabricate the resistor string and switching transistors is reduce by half or more.

A further advantage, reduced settling time, is also achieved. Settling time is defined as the amount of time required to charge parasitic capacitance up to a relatively steady state value. Output node 14 has some parasitic capacitance with respect to ground. The power to charge the parasitic capacitance is provided by energy source 4 energizing potential $V_1$. The power passes through a portion of the resistor string and switching transistors. With multiple switching transistors switched to the on state and a corresponding reduction in the number of resistors required in the resistor string, the parasitic capacitance can be charged in less time. For example, with the capability to switch two transistors to be in the on state at the same time reduces the number of required resistors in the resistor string by half, and results in the ability to charge the parasitic capacitance in half of the time required as compared to having twice as many resistors and a single switching transistor switched on.

Even those output values requiring only one switching transistor to be switched to the on state can be obtained by turning on two switching transistors so that the reduction in settling time can be realized. Typically the two switching transistors would not be adjacent transistors in resistor string 12. For example, to obtain the voltage at intermediate tap $T_{10}$ at output node 14 or output amplifier 18, rather than switching transistor $M_{10}$ to the on state, transistors $M_9$ and $M_{11}$ can be switched to the on state by driver circuit 2 which produces at output node 14 a voltage that is substantially the voltage at intermediate tap $T_{10}$. Alternatively, switching transistors $M_8$ and $M_{12}$ could be switched to the on state to generate substantially the same voltage at output node 14.

An analog-to-digital converter 100, incorporating a digital-to-analog converter in accordance with the illustrative embodiment of the invention, is shown in FIG. 4. An analog signal 102 is received and provides the positive input to comparator 104. Initially the successive approximation circuitry 106 turns on the appropriate switching transistor or transistors $M_1$ though $M_{17}$ to produce the midpoint voltage of resistor string 112 at node 114. The voltage at node 114 provides the input to output amplifier 118 which may amplify the signal it receives and may convert the signal to another form, such as from a voltage output to a current output. The output 130 of output amplifier 118 provides the negative input to comparator 104. Comparator 104 compares the output 130 of output amplifier 118, which is a generated analog signal, to analog signal 102 which may be maintained on a sample-and-hold circuit.

Successive approximation circuitry 106 initially turns on the appropriate switching transistor or transistors $M_1$ through $M_{17}$ to produce the midpoint voltage of resistor string 112 as analog signal 130. If the output 132 is positive, the midpoint of the upper half of the resistor string 112 is electrically coupled as the input to comparator 104 and compared to analog signal 102. If the output 132 is negative, the midpoint of the lower half of the resistor string 112 is electrically coupled as the input to output amplifier 118 and compared to analog signal 102. The selection of the switching transistor or transistors that are switched on, as described above, are controlled by successive approximation circuitry 106. Starting with a default bit pattern, each iteration determines one bit in the binary, or other coded, representation 134, and the successive approximation process continues until all bits are determined. The successive approximation process is similar to known successive approximation processes but differs in that one or more switching transistors may be switched to the on state to couple a midpoint voltage as an input to comparator 104 where the midpoint voltages are not limited to being voltages at the intermediate taps. The binary representation 134 is provided as the output of successive approximation circuitry 106 and analog-to-digital converter 100.

The invention is particularly useful in communication systems and equipment employing integrated circuits in digital-to-analog and analog-to-digital converter applications. Such communication systems and equipment have the advantage of maintaining resolution while reducing silicon area requirements by reducing the number of resistors and switching transistors and improving settling time.

While the illustrative embodiment of the invention has been described as decoding a binary, or other coded, signal and in response to the decoded binary signal energizing a single row select line and multiple column select lines to couple two adjacent intermediate taps to an output node, the invention is not limited thereto. One of ordinary skill in the art can recognize that multiple row select lines could be energized in conjunction with a single column select line depending on the row and column decoding circuits, with the same result. Furthermore, while the illustrative embodiment has disclosed coupling only two intermediate taps to output node 14, one skilled in the art can recognize the benefit of coupling three or more intermediate taps to the output node simultaneously and could design decoding circuitry for an analog-to-digital or a digital-to-analog converter to achieve this result.

I claim:

1. A digital-to-analog converter for providing an analog output, the converter comprising:
   a resistor string comprising a plurality of resistors and defining intermediate taps;
   a plurality of switching transistors, each of the switching transistors coupled between a respective intermediate tap and an output node; and
   a selection circuit coupled to a terminal of each of the switching transistors for selectively switching transistors, the selection circuit capable of switching at least two switching transistors to couple at least two intermediate taps to the output node to produce a voltage at the output node that is intermediate voltages developed at intermediate taps when the resistor string is energized, whereby at least two intermediate taps are electrically coupled to the output node to produce at least one analog output.

2. A digital-to-analog converter for receiving a digital input and providing an analog output signal, the converter comprising:
   a resistor string defining intermediate taps;
   a first decode circuit for decoding a first group of bits of the digital input, the first decoding circuit capable of energizing a first select line in response to the first group of bits;
   a second decode circuit for decoding a second group of bits of the digital input, the second decoding circuit capable of energizing at least two second select lines in response to the second group of bits; and
   a plurality of switching transistors, each of said switching transistors coupled between an output node and a respective intermediate tap, the second select lines switching at least two switching transistors to couple at least two intermediate taps to the output node to produce as the analog output signal a voltage that is intermediate voltages developed at the intermediate taps.

3. A digital-to-analog converter as recited in claim 2, wherein the first decode circuit is capable of energizing a row select line.

4. A digital-to-analog converter as recited in claim 2, wherein the second decode circuit is capable of energizing column select lines.

5. A digital-to-analog converter as recited in claim 2, wherein the first decode circuit is capable of energizing a column select line.

6. A digital-to-analog converter as recited in claim 2, wherein the second decode circuit is capable of energizing row select lines.

7. An analog-to-digital converter for generating a digital representation of an analog signal, comprising:
   a comparator receiving the analog signal and a generated analog signal, the comparator generating a difference output signal that is the difference between the analog signal and the generated analog signal;
   a resistor string comprising a plurality of resistors capable of being driven by an energy source, the resistor string defining intermediate taps;
   a plurality of switching transistors, at least two of the switching transistors coupled between respective intermediate taps and an output node;
   a successive approximation switching transistor selection and driving circuit, the successive approximation circuit receiving the difference output signal from the comparator, the successive approximation circuit coupled to a terminal of each of the switching transistors coupled to the output node for switching on selected ones of the switching transistors, the successive approximation circuit capable of switching at least two switching transistors to couple at least two intermediate taps to the output node to produce as the generated analog signal a voltage that is intermediate voltages developed at the intermediate taps when the resistor string is energized by an energy source, the successive approximation circuit successively approximating the analog signal and producing a digital representation thereof as an output.

8. A digital-to-analog converter for providing an analog output, the converter comprising:
   a resistor string comprising a plurality of resistors and defining intermediate taps;
   a plurality of switches, each of the switches coupled between a respective intermediate tap and an output node; and
   a selection circuit coupled to a terminal of each of the switches for selectively switching switches, the selection circuit capable of switching at least two switches to couple at least two intermediate taps to the output node to produce a voltage at the output node that is intermediate voltages developed at intermediate taps when the resistor string is energized, whereby at least two intermediate taps are electrically coupled to the output node to produce at least one analog output.

* * * * *